United States Patent
Liu et al.

(10) Patent No.: US 6,271,115 B1
(45) Date of Patent: Aug. 7, 2001

(54) POST METAL ETCH PHOTORESIST STRIP METHOD

(75) Inventors: Wen Jun Liu; Simon Chooi; Mei Sheng Zhou; Raymond Joy, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/604,065

(22) Filed: Jun. 26, 2000

(51) Int. Cl.$^7$ ...................... H01L 21/4763; H01L 21/302
(52) U.S. Cl. .......................... 438/618; 438/710; 438/725; 430/330
(58) Field of Search .................................... 438/618, 308, 438/710, 725, 726–729; 430/329–330

(56) References Cited

U.S. PATENT DOCUMENTS

| | | | |
|---|---|---|---|
| 4,732,658 | 3/1988 | Lee | 437/228 |
| 5,792,672 | 8/1998 | Chan et al. | 438/6 |
| 5,824,604 | 10/1998 | Bar-Gadda | 438/725 |
| 5,998,104 | * 12/1999 | Fujimura et al. | 430/329 |
| 6,044,850 | * 4/2000 | Ozawa et al. | 438/725 |
| 6,184,119 | * 2/2001 | Ku et al. | 438/597 |

FOREIGN PATENT DOCUMENTS

0304046 A2  *  2/1989  (EP) .................. G03F/7/26

* cited by examiner

Primary Examiner—Charles Bowers
Assistant Examiner—Thanh Nguyen
(74) Attorney, Agent, or Firm—George O. Saile; Rosemary L. S. Pike (57) ABSTRACT

An improved method for removing a photoresist mask from an etched aluminum pattern after etching the pattern in a chlorine containing plasma has been developed. The method is a five step process, in which the first step is in a microwave generated plasma containing $O_2$ and $H_2O$; the second step is in a microwave generated plasma containing $O_2$ and $N_2$; the third step is in a microwave generated plasma containing $H_2O$; the fourth step is in a microwave generated plasma containing $O_2$ and $N_2$; and the fifth step is in a microwave generated plasma containing $H_2O$. The first step which initiates removal of photoresist while simultaneously beginning the passivation process causes residue-free removal of photoresist following etching of aluminum or aluminum-copper layers in chlorine bearing etchants.

24 Claims, 4 Drawing Sheets

POST METAL ETCH PHOTORESIST STRIP METHOD

BACKGROUND OF THE INVENTION (1) Field of the Invention

This invention relates to a method of fabrication used for semiconductor integrated circuit devices, and more specifically to an improved method of post-metal etch stripping of a photoresist mask and removal of residual corrosion inducing components.

(2) Description of Related Art

Figure 1:
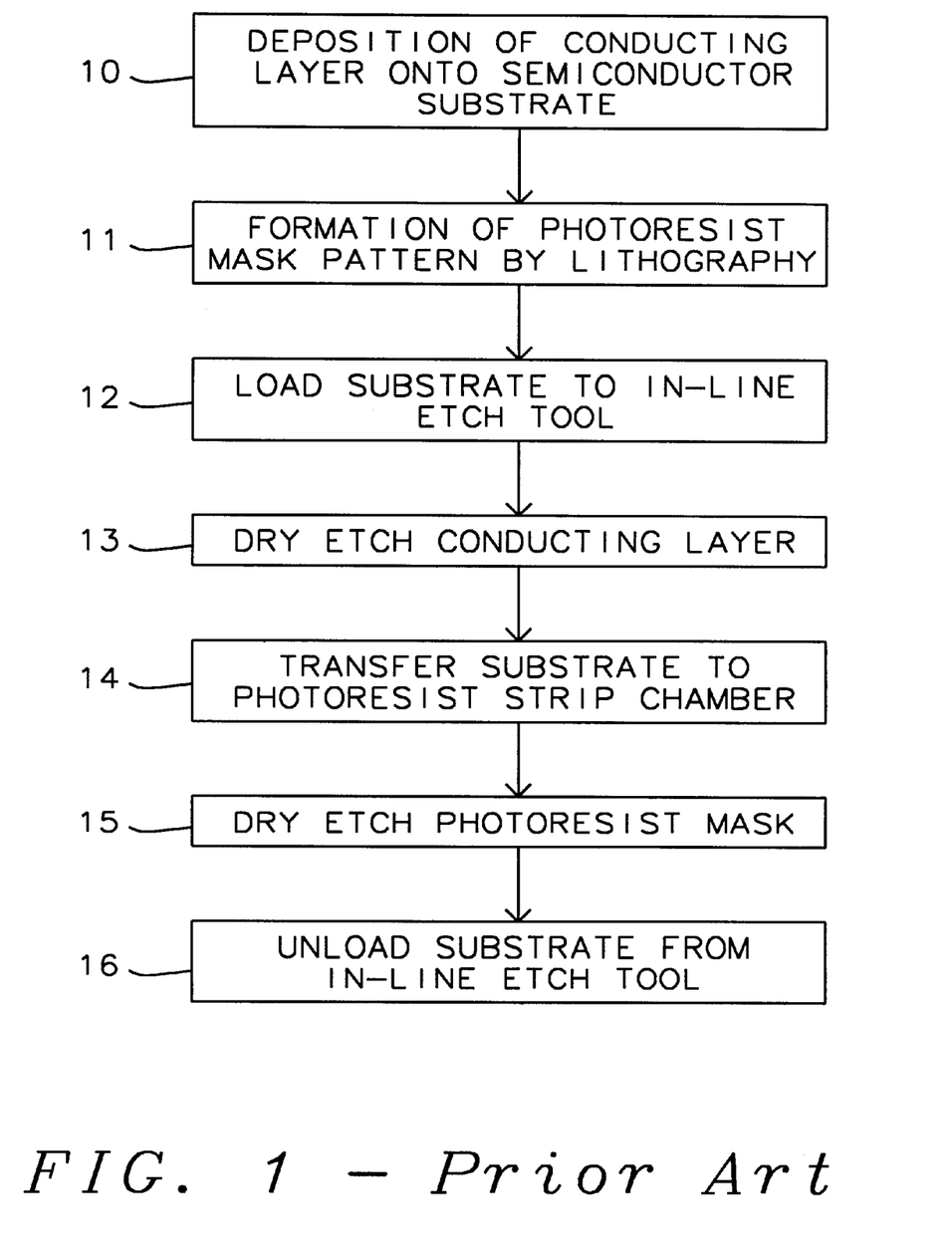
FIG. 1, which is a flow chart for the method of etching a conducting layer to form an interconnection pattern on a semiconductor substrate.

In the fabrication of semiconductor integrated circuits metal conductor lines are used to interconnect the many components in device circuits. Due to shrinkage in size of semiconductor components and increased circuit density, the complexity of interconnecting the many components in the dense circuits requires that the fabrication processes used to define the metal interconnect patterns provide precise dimensional control. Advances in lithography and masking techniques and dry etching processes, such as RIE (Reactive Ion Etching) and other plasma etching processes, allow production of sub-micron width conducting patterns with spacings also in the sub-micron range. In general, as illustrated in FIG. 1, the process steps used to pattern metal conductor patterns comprise: Step 10, deposition of a conducting layer; Step 11, formation by standard lithographic techniques of a photoresist mask or other mask, such as titanium oxide, silicon oxide or silicon oxynitride, in the form of the desired metal interconnection pattern; Step 12, loading the substrate to an etch tool; Step 13, dry etching to remove the conducting layer from areas not covered by the mask; Step 14, transferring the substrate to a photoresist strip chamber; Step 15, removing the photoresist mask layer, exposing the top surface of the metal layer; and then, Step 16, unloading the substrate from the etch tool.

As is well known in the industry, dry etching processes for metal layers composed of aluminum or aluminum alloys use chlorine and chlorine compounds as reactive components in the etchant gas. During the etching process the chlorine and chlorine compounds, as well as chlorine bearing reaction products, become embedded in and/or attached to the masked pattern sidewalls and other surfaces on the substrate. For example, chlorine and chlorine compounds and chlorine bearing reaction products become embedded into the photoresist mask on top of the etched metal pattern and attached to the sidewalls of the etched pattern. If the chlorine, chlorine compounds, and chlorine bearing reaction products are not removed or passivated before the substrate is exposed to the atmosphere of the manufacturing plant, then the residual chlorine causes corrosion and attack of the etched metal pattern. This corrosion is unacceptable, thereby reducing the yield of the metal etch process. Additionally, if the corrosion is not immediately detected, it will show up later as a cause for a device failure or as a contributing factor in a reliability failure mechanism. Therefore, it is extremely important that following a metal etch process the residual chlorine, chlorine compounds, and chlorine bearing reaction products be removed from all surfaces of the substrate and sidewalls of the etched metal pattern. The challenge in the industry is to provide post-metal etch processes which efficiently and effectively strip the photoresist mask and, also, remove residual chlorine, chlorine compounds, and chlorine bearing reaction products.

It is a well known fact that $O_2$ can be used to remove or etch photoresist, as shown in U.S. Pat. No. 4, 732,658 entitled "Planarization Of Silicon Semiconductor Devices" granted Mar. 22, 1988 to Eddie C. Lee, which shows a dielectric planarization process in which a photoresist layer is deposited over a dielectric layer having topographical features and then etching back all of the photoresist and enough of the dielectric layer to form a substantially planar surface of the dielectric material. The etchback process, using $CHF_3$ and $O_2$, etches photoresist and the dielectric at substantially the same rate. However, this patent does not address the removal of chlorine, chlorine compounds, or chlorine bearing reaction products following dry etching of an aluminum interconnection pattern.

U.S. Pat. No. 5,792,672 entitled "Photoresist Strip Method" granted Aug. 11, 1998 to Lap Chan et al. describes a two step photoresist strip method in which after etching a conducting material the substrate containing the etched pattern is transferred to a second heated chamber and the photoresist is stripped first in a plasma containing $O_2$ and $H_2O$ and second in a plasma containing $O_2$. While this process offers an improvement to state-of-the-art photoresist stripping, there continues to remain a challenge to devise effective methods to strip photoresist masks from etched aluminum or aluminum-copper interconnection patterns subsequent to etching the pattern in a chlorine containing plasma and to remove chlorine, chlorine compounds, or chlorine bearing reaction products following the dry etching of the aluminum or aluminum-copper interconnection pattern.

U.S. Pat. No. 5,824,604 entitled "Hydrocarbon-Enhanced Dry Stripping Of Photoresist" granted Oct. 20, 1998 to Ronny Bar-Gadda describes a method of stripping photoresist using a microwave stripper and a plasma containing an oxidizing gas, a fluoride-containing compound, and a hydrocarbon-containing reactive species.

The present invention is directed to a novel method of stripping a photoresist mask from the surface of an aluminum or aluminum-copper pattern formed by dry etching processes using gaseous $Cl_2$ and $BCl_3$ etchants by using alternating steps for passivation and photoresist stripping which sequentially passivate the etched aluminum or aluminum-copper surfaces and remove the photoresist. Superior results are obtained using a five step process which combines passivation and photo-resist stripping in Step 1, followed by photoresist stripping in Step 2, followed by passivation in Step 3, followed by photoresist stripping in Step 4, followed by passivation in Step 5.

SUMMARY OF THE INVENTION

It is a general object of the present invention to provide an improved method for removing a photoresist mask from an etched aluminum or aluminum-copper pattern after etching the pattern in a chlorine containing plasma.

Another object of the present invention is to provide an improved method for removing residual chlorine containing fragments from the surfaces and sidewalls of an aluminum or aluminum-copper pattern after etching the pattern in a chlorine containing plasma.

In accordance with the present invention, the above and other objectives are realized by using a method of fabrication of a conductive interconnection layer in an integrated circuit comprising the steps of: loading a wafer cassette, containing substrates having a photoresist mask pattern formed over a conductive material layer, to a plasma etcher apparatus; etching the conductive material layer by vertical anisotropic etching; transferring the substrate to a second heated chamber; and first stripping, using a microwave generated plasma, the photoresist mask in the second heated chamber in a first plasma containing $O_2$ and $H_2O$.

A second embodiment of the present invention comprises the steps of: loading a wafer cassette, containing substrates having a photoresist mask pattern formed over a conductive material layer, to a plasma etcher apparatus; etching the conductive material layer by vertical anisotropic etching; transferring the substrate to a second heated chamber; and first stripping, using a microwave generated plasma, the photoresist mask in the second heated chamber in a first plasma containing $O_2$ and $H_2O$ and one or more gases from the group comprising nitrogen, hydrogen, fluorine, fluorocarbons, fluorine-substituted hydrocarbons, hydrogen bromide, forming gas and argon or other inert gases.

A third embodiment of the present invention comprises the steps of: loading a wafer cassette, containing substrates having a photoresist mask pattern formed over a conductive material layer, to a plasma etcher apparatus; etching the conductive material layer by vertical anisotropic etching; transferring the substrate to a second heated chamber; first stripping, using a microwave generated plasma, the photoresist mask in the second heated chamber in a first plasma containing $O_2$ and $H_2O$; and second stripping, using a second microwave generated plasma, the photoresist mask in the second heated chamber, in a second microwave generated plasma containing $O_2$ and $N_2$.

In a fourth embodiment of the present invention the initiation of the first stripping, using a microwave generated plasma, of the photoresist mask in the second heated chamber in a first plasma containing $O_2$ and $H_2O$ is preceded by one or more steps that occur when the substrate is transferred to the second heated chamber, where the one or more steps are from the group comprising the steps of: a) heating the substrate to a predetermined temperature; b) reducing or eliminating chlorine, chlorine compounds and chloride compounds from the photoresist, sidewall residue and metal through heating and/or using one or more gases from the group containing fluorine, fluorine-substituted hydrocarbons, fluorocarbons, nitrogen, hydrogen, forming gas and argon and other inert gases; or c) stabilizing gas flows in the second heated chamber.

And in yet a fifth embodiment of the present invention the above and other objectives are realized by using a method of fabrication of a conductive interconnection layer in an integrated circuit comprising the steps of: loading a wafer cassette, containing substrates having a photoresist mask pattern formed over a conductive material layer, to a plasma etcher apparatus; etching the conductive material layer by vertical anisotropic etching; transferring the substrate to a second heated chamber; first stripping, using a microwave generated plasma, the photoresist mask in a second heated chamber in a first plasma containing $O_2$ and $H_2O$; and then further stripping one or more times the photoresist mask in the second heated chamber in a microwave generated plasma containing $O_2$ and $H_2O$.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved method for removing a photoresist mask from an etched aluminum pattern after etching the pattern in a chlorine containing plasma will now be described in detail. The method can be used for stripping a photo-resist mask from an etched pattern in an aluminum layer or an aluminum alloy layer, such as aluminum-copper or aluminum-copper-silicon, where copper is between about 0.2 and 2% and silicon is between about 0.1 and 1%. The method can further be used to strip a photoresist mask from an etched pattern in a multilayered conducting structure, which contains an aluminum, aluminum-copper, or aluminum-copper-silicon layer and adhesion, barrier and ARC (Anti-Reflection Coating) layers. Examples of such conducting layers commonly used in the industry are listed in Table 1. In such multi-layered conducting structures Ti is used to provide a low resistance contact to doped silicon regions through the formation of

TABLE 1

Ti/TiN/Al—Cu/TiN
Ti/TiN/Al—Cu/Ti/TiN
Ti/TiW/Al—Cu/TiN
Ti/Al—Cu/TiN
Ti/TiN/Al—Cu—Si/TiN
Ti/TiN/Al—Cu—Si/Ti/TiN
Ti/TiW/Al—Cu—Si/TiN
Ti/Al—Cu—Si/TiN titanium silicide and to provide adhesion to insulating layers; TiW or TiN is used as a barrier layer to prevent penetration of Al into shallow silicon junctions; Al—Cu or Al—Cu—Si is the primary conducting layer and Ti, Ti/TiW, or Ti/TiN under the Al—Cu or Al—Cu—Si layer serves as an adhesion layer; TiN on top of all the structures serves as an ARC (Anti-Reflection Coating) layer to facilitate formation of the mask pattern in photoresist by photolithography. The method can further be used to strip a photoresist mask from an etched pattern in the multilayered conducting structure, wherein the photoresist mask comprises photoresist used for I-line lithography or a combination of deep ultraviolet (DUV) resist and organic BARC (Bottom Anti-Reflection Coating). Only the specific areas unique to understanding the present invention will be described in detail.

Photoresist mask removal from an etched aluminum pattern after etching the pattern in a chlorine containing plasma consists of alternating passivation and strip steps. An example of alternating passivation and strip steps is shown in Table 2. The passivation step utilizes water vapor, but

TABLE 2

| PARAMETER | PASSIVATION | STRIP | PASSIVATION | STRIP |
|---|---|---|---|---|
| Pressure (Torr) | 2 | 2 | 2 | 2 |
| Power (Watts) | 1400 | 1400 | 1400 | 1400 |
| $O_2$ (sccm) | — | 3500 | — | 3500 |
| $H_2O$ (sccm) | 500 | — | 500 | — |
| $N_2$ (sccm) | — | 200 | — | 200 |
| Temp. (° C.) | 200–270 | 200–270 | 200–270 | 200–270 |
| Time (sec.) | 20 | 40 | 20 | 40 | can also include one or more gases from the group containing nitrogen, fluorocarbons, fluorine-substituted hydrocarbons, fluorine, hydrogen bromide, hydrogen and forming gas. The passivation step protects the metal by forming metal oxide (e.g. aluminum to aluminum oxide), and reacts with metal-chloride bonds to form metal oxide and volatile hydrogen chloride, resulting in the prevention of corrosion of the aluminum pattern. The strip step utilizes oxygen, but can also include one or more gases from the group containing nitrogen, fluorocarbons, fluorine-substituted hydrocarbons, fluorine, hydrogen bromide and forming gas. The function of the strip step is mainly photoresist and BARC removal, but this strip step, also, reacts with carbon-chlorine bonds.

Several disadvantages and deficiencies have been observed, when using the process sequence listed in Table 2. First, passivation with pure $H_2O$ and high power in the first step results in poor uniformity of photoresist removal. Also, due to the high power the remaining photoresist mask becomes additionally hardened, resulting in further difficulty for removal by the subsequent steps. The result is that residue of the photoresist mask, in the form of sub-micron spots, remain on the top surface of the TiN anti-reflection coating on the aluminum or aluminum-copper interconnection patterns following the passivation and mask stripping process. This photoresist mask residue will affect the adhesion of the subsequently deposited inter-metal dielectric layer (e.g. silicon oxide) and is therefore unacceptable for a reliable manufacturing process.

Modifications to the passivation process have been investigated and results of experiments to study the effect of $O_2$ additions to $H_2O$ plasmas are recorded in Table 3.

TABLE 3

| $O_2$ sccm | $H_2O$ sccm | Power Watts | Strip Rate Å/min. | Uniformity % |
|---|---|---|---|---|
| 0 | 500 | 800 | 16,019 | 7.3 |
| 0 | 500 | 1400 | 16,527 | 40.5 |
| 500 | 500 | 800 | 16,800 | 3.4 |
| 500 | 500 | 1400 | 19,425 | 5.3 |
| 250 | 500 | 1100 | 17,766 | 5.6 |

Referring to Table 3, it is seen that addition of $O_2$ to a $H_2O$ plasma causes an increase in the removal rate of photoresist and more uniform removal of the photoresist. The presence of the $O_2$ in the plasma allows effective removal of the photoresist before it is additionally hardened by the plasma and the incidence of sub-micron photoresist residue spots is mitigated.

By initiating the photoresist stripping in an $O_2/H_2O$ plasma (i.e. passivation and strip step) uniform photoresist removal is insured. The ratio of $O_2$ to $H_2O$ is between about 0.05 to 10. This is the key step in effective removal of photoresist masks following etching of aluminum or aluminum-copper layers in chlorine bearing etchants. Although the initial passivation and strip step uses an $O_2/H_2O$ mixture, one or more gases from the group comprising nitrogen, hydrogen, fluorine, fluorocarbons, fluorine-substituted hydrocarbons, hydrogen bromide, forming gas and argon or other inert gases can be added during the passivation and strip step. The ratio of $O_2$ relative to each of the additional gases is between about 1 and 100. With the passivation and strip step as the initial step of the photoresist stripping sequence, the strip steps and/or the passivation steps that follow can be part of many sequential combinations.

Table 4 lists an example of a sequence of five steps for effective passivation and stripping of photoresist. Other

TABLE 4

| PARAMETER | STEP 1 PASSIVATION AND STRIP | STEP 2 STRIP | STEP 3 PASSIVATION | STEP 4 STRIP | STEP 5 PASSIVATION |
|---|---|---|---|---|---|
| Pressure (Torr) | A1 | A1 | A1 | A1 | A1 |
| Power (Watts) | A2 | A2 | A2 | A2 | A2 |
| $O_2$ (sccm) | 100–1000 | A3 | — | A3 | — |
| $H_2O$ (sccm) | A4 | — | A4 | — | A4 |
| $N_2$ (sccm) | — | A5 | — | A5 | — |
| Temp. (° C.) | A6 | A6 | A6 | A6 | A6 |
| Time (sec.) | A7 | A7 | A7 | A7 | A7 |

WHERE A1 = 1 to 10 Torr
A2 = 600 to 1900 Watts
A3 = 1000 to 5000 sccm
A4 = 100 to 1500 sccm
A5 = 100 to 900 sccm
A6 = 150° to 350° C.
A7 = 5 to 120 sec.

sequences which provide effective passivation and stripping of photoresist include (but are not restricted to):

1) passivation and strip - strip
2) passivation and strip - passivation
3) passivation and strip - strip - passivation
4) passivation and strip - passivation - strip
5) passivation and strip - strip - passivation . . . where the strip - passivation sequence is repeated more than once.
6) passivation and strip - passivation - strip . . . where the passivation - strip sequence is repeated more than once.
7) passivation and strip - strip - passivation - passivation - strip In each case effective and efficient photoresist mask removal is obtained by initiating the photoresist mask removal in a combined passivation and strip step, then followed by various strip steps and passivation steps. Additionally, the combined passivation and strip step can also occur at least once more in the photoresist stripping sequence after its initial step appearance.

In the example given in Table 4, photoresist stripping is first initiated using an $O_2/H_2O$ plasma, which simultaneously begins the passivation process due to the presence of $H_2O$ in the plasma. In this first step the flow of $O_2$ is maintained at between about 100 and 1000 sccm. This relatively low flow of $O_2$ permits initiation of photoresist removal without attenuating the $H_2O$ passivation process.

The ratio of $O_2$ to $H_2O$ is between about 0.05 to 10. Then follows alternating steps of photoresist stripping in an $O_2/N_2$ plasma and passivation in a $H_2O$ plasma. In these stripping steps the flow of $O_2$ is maintained between about 1000 and 5000 sccm and the ratio of $O_2$ to $N_2$ is between about 1 and 100.

Figure 2A:
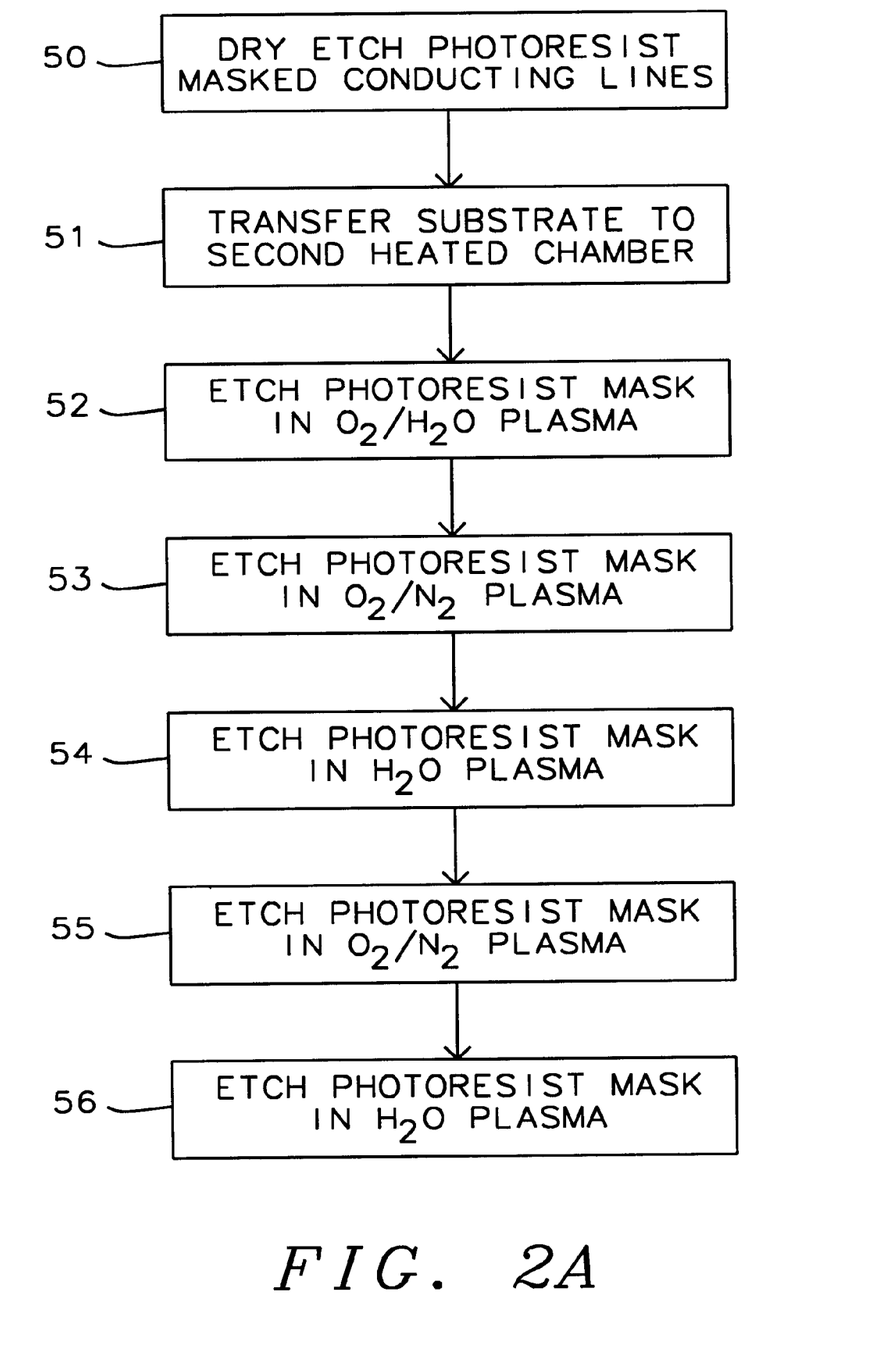
FIG. 2A, which is a flow chart of the method of one embodiment of the present invention.

Now referring to FIG. 2A, the basic steps 50, 51, 52, 53, 54, 55 and 56, of an example of the method of the present invention are summarized. These steps will be described below in conjunction with FIGS. 3–5.

Figure 3A:
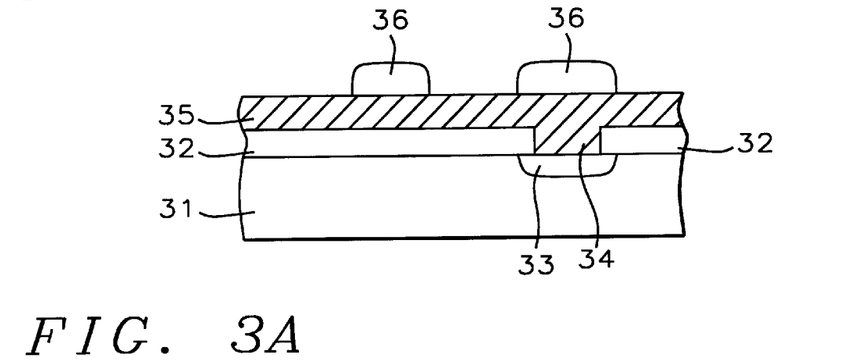
FIG. 3A, which schematically, in cross-sectional representation, illustrates a photoresist masked conducting layer on a semiconductor substrate, prior to etching the conducting layer.

FIG. 3A, schematically in cross-sectional representation, depicts a portion of a semiconductor device. The substrate 31 is conventionally a monocrystalline semiconductor substrate provided with an overlying dielectric layer 32. At least one contact opening 34 is formed in the dielectric layer 32 for making contact to a doped region 33 in the substrate 31. In fabricating integrated circuit semiconductor devices, the substrate 31 will conventionally have fabricated therein various active and passive devices which are not illustrated in FIGS. 3–5, since they are not part of the present invention. The devices may include metal oxide semiconductor field effect transistor, MOSFET, devices of either NFET or PFET types and/or complimentary CMOS as well as BiCMOS devices. Conducting layer 35 is formed over the dielectric layer 32 and into the contact opening 34. Conventional lithographic techniques are used to define the photoresist pattern 36 on top of the conducting layer 35.

Figure 3B:
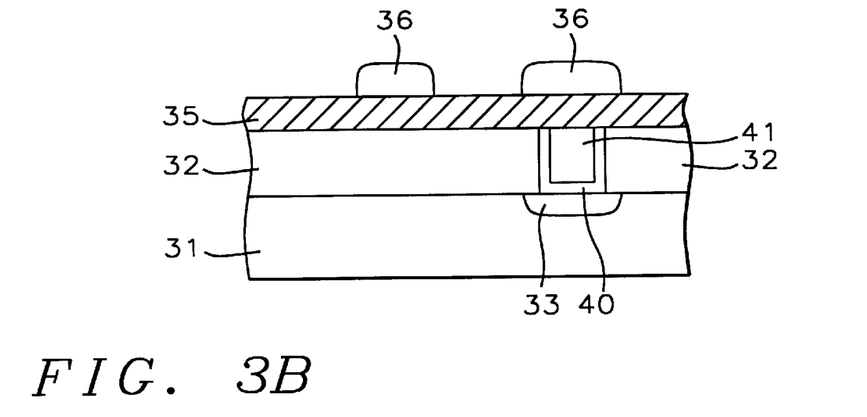
FIG. 3B, which schematically, in cross-sectional representation, illustrates a photoresist masked conducting layer on a semiconductor substrate containing a conducting stud embedded in a dielectric layer.
Figure 3C:
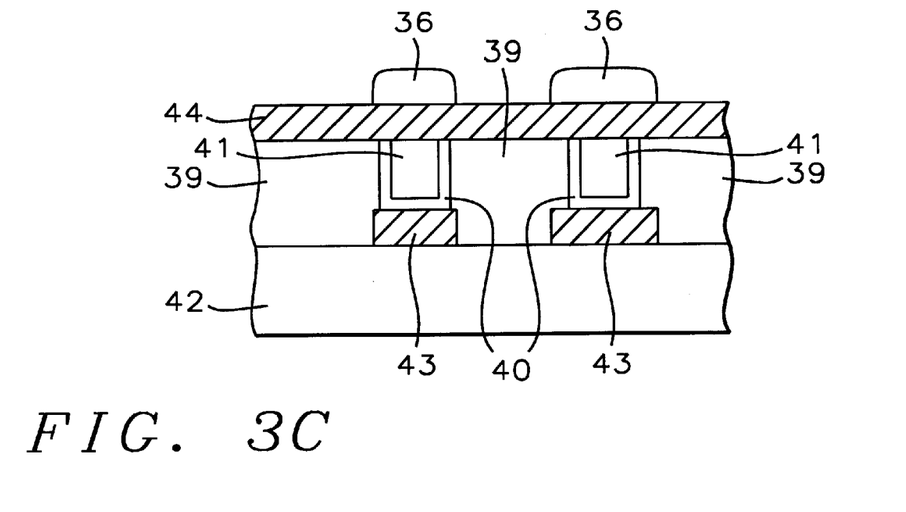
FIG. 3C, which schematically, in cross-sectional representation, illustrates a photoresist masked conducting layer on a semiconductor substrate containing multilevel conducting interconnections.

FIGS. 3B and 3C, schematically in cross-sectional representations, depict alternate examples of interconnection schemes used in integrated circuits. In FIG. 3B, the substrate 31 is conventionally a monocrystalline semiconductor substrate provided with an overlying dielectric layer 32. Contact is made to a doped region 33 via a contact opening in layer 32 filled with a barrier metal bilayer of Ti/TiN 40 and tungsten 41. After deposition of the barrier metal bilayer of Ti/TiN 40 and tungsten 41 a CMP (Chemical Mechanical Planarization) process is used to polish away excess tungsten and Ti/TiN leaving a conducting stud embedded in the dielectric layer 32. FIG. 3C depicts BEOL (Back-End-Of-Line) multilevel interconnections, where substrate 42 is a dielectric layer. Dielectric layer 42 may contain other microelectronic layers (not shown) comprising dielectric, conductor, polysilicon and other materials. Formed on the dielectric layer 42 is an etched multilayer conductor pattern 43. An inter-metal dielectric layer 39 is formed over the multilayer conductor pattern 43 and contact is made to the multilayer conductor pattern 43 via a contact opening in layer 39 filled with a barrier metal bilayer of Ti/TiN 40 and tungsten 41. After deposition of the barrier metal bilayer of Ti/TiN 40 and tungsten 41 a CMP (Chemical Mechanical Planarization) process is used to polish away excess tungsten and Ti/TiN leaving a conducting stud embedded in the dielectric layer 39. The top multilayer conducting layer 44 is formed over the dielectric layer 39 and conventional lithographic techniques are used to define the photoresist pattern 36 on top of the conducting layer 44.

Figure 4:
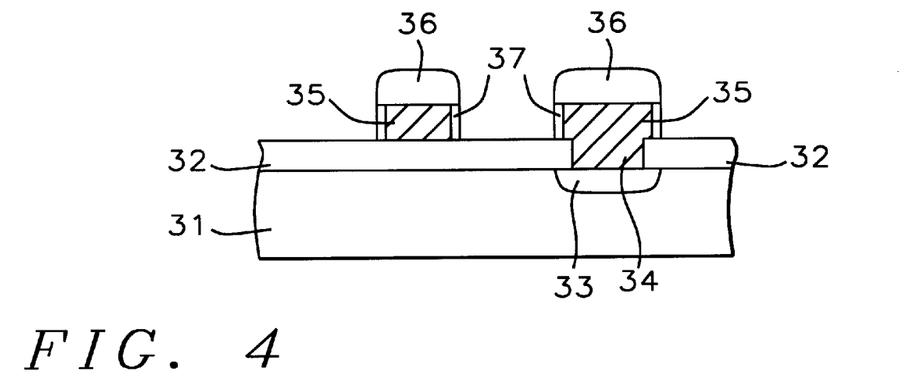
FIG. 4, which schematically, in cross-sectional representation, illustrates an etched pattern in a conducting layer, prior to stripping the photoresist mask.
Figure 5:
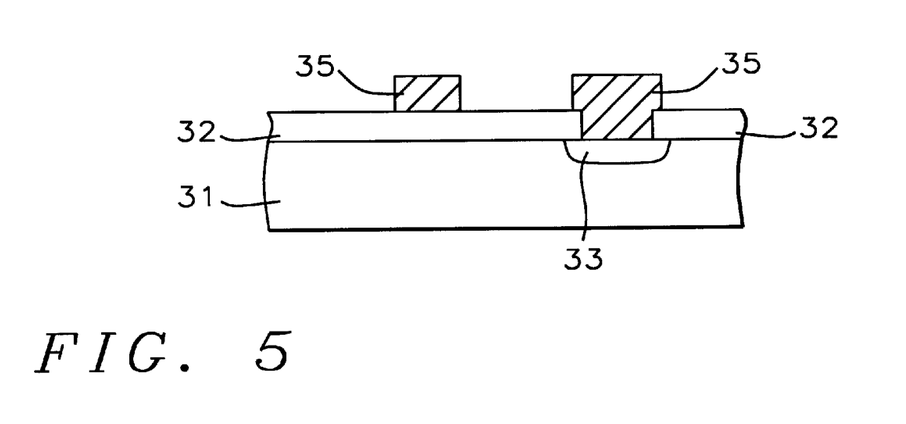
FIG. 5, which schematically, in cross-sectional representation, illustrates an etched pattern in a conducting layer, after stripping the photoresist mask.

The substrate is then loaded into an in-line etch tool such as a Lam Research TCP9608, Lam Research PTX or Applied Materials DPS Centura and the conducting layer 35 is etched (Step 50 in FIG. 2A) in a plasma containing $Cl_2$ and $BCl_3$, as shown schematically in cross-sectional representation in FIG. 4. Alternate etch plasmas may contain $Cl_2$, $BCl_3$ and nitrogen, $Cl_2$, $BCl_3$ and $CHF_3$, or $Cl_2$, $BCl_3$, $CHF_3$ and nitrogen. During this etch step the unmasked regions of the conducting layer 35 are removed and thin sidewall layers 37 containing redeposited photoresist and chlorine containing substances (or chlorine and fluorine containing substances if $CHF_3$ is used) are deposited onto the etched pattern in layer 35.

The substrate is then transferred (Step 51 in FIG. 2A) to a second chamber, which is heated in the range between about 100° and 400° C., for removal of the remaining photoresist mask. This second chamber may be an additional chamber incorporated in an in-line etch tool or may be a separate microwave photoresist stripping chamber, such as those manufactured by Gasonics, Mattson, and other photoresist stripper tool manufacturers. Referring to FIG. 2A, the photoresist etch process is a five-step process in which the first step, Step 52, etches the photoresist mask in an $O_2/H_2O$ microwave plasma containing $O_2$ at a flow between about 100 and 1000 sccm and $H_2O$ at a flow between about 100 and 1500 sccm, at a total pressure between about 1 and 10 Torr, and with the $O_2/H_2O$ microwave plasma having a frequency of about 2.45 GHz and applied power between about 600 and 1800 Watts. The ratio of $O_2$ to $H_2O$ is between about 0.05 to 10. The second step, Step 53, etches the photoresist mask in an $O_2/N_2$ microwave plasma containing $O_2$ at a flow between about 1000 and 5000 sccm and $N_2$ at a flow between about 100 and 900 sccm, at a total pressure between about 1 and 10 Torr, and with the $O_2/N_2$ microwave plasma having a frequency of about 2.45 GHz and applied power between about 600 and 1800 Watts. The ratio of $O_2$ to $N_2$ is between about 1 and 100. The third step, Step 54, etches the photoresist mask in a $H_2O$ microwave plasma containing $H_2O$ at a flow between about 100 and 1500 sccm, at a total pressure between about 1 and 10 Torr, and with the $H_2O$ microwave plasma having a frequency of about 2.45 GHz and applied power between about 600 and 1800 Watts. The fourth step, Step 55, etches the photoresist mask in an $O_2/N_2$ microwave plasma containing $O_2$ at a flow between about 1000 and 5000 sccm and $N_2$ at a flow between about 100 and 900 sccm, at a total pressure between about 1 and 10 Torr, and with the $O_2/N_2$ microwave plasma having a frequency of about 2.45 GHz and applied power between about 600 and 1800 Watts. The ratio of $O_2$ to $N_2$ is between about 1 and 100. The fifth step, Step 56, etches the photoresist mask in a $H_2O$ microwave plasma containing $H_2O$ at a flow between about 100 and 1500 sccm, at a total pressure between about 1 and 10 Torr, and with the $H_2O$ microwave plasma having a frequency of about 2.45 GHz and applied power between about 600 and 1800 Watts. The benefits of the five-step photoresist etch process are to use an $O_2/H_2O$ microwave plasma, Step 52, to begin removal of chlorine, chlorine compounds, and chlorine bearing reaction products which are embedded into the photoresist mask on top of the etched pattern and attached to the sidewalls of the etched pattern following the conductor layer $Cl_2/BCl_3$ etch process and simultaneously initiate uniform stripping of photoresist before it is further hardened by exposure to plasma processing. Then subsequent alternating steps, Steps 53–56, of stripping photoresist in an $O_2/N_2$ plasma followed by passivation in a $H_2O$ plasma complete the photoresist mask removal process. Alternatively, the passivation and strip step, Step 52, can be preceded by one or more steps that occur when the substrate is transferred to the second heated chamber (Step 51 in FIG. 2A). The aforementioned one or more steps would not strip the photoresist, but would function to cause one or more of the following results: a) Heating the substrate to a predetermined temperature; b) Reduction or elimination of chlorine, chlorine compounds and chloride compounds from the photoresist, sidewall residue and metal through heating and/or using one or more gases from the group containing fluorine, fluorine-substituted hydrocarbons, fluorocarbons, nitrogen, hydrogen, forming gas and argon and other inert gases; c) Stabilization of gas flows in the second chamber.

Alternatively, in another embodiment of the invention the combined passivation and strip step, Step 52, may not be implemented as the initial step of the photoresist stripping process, but is inserted one or more times after a separate first step or after a further one or more steps after the first step of the photoresist stripping process.

Figure 2B:
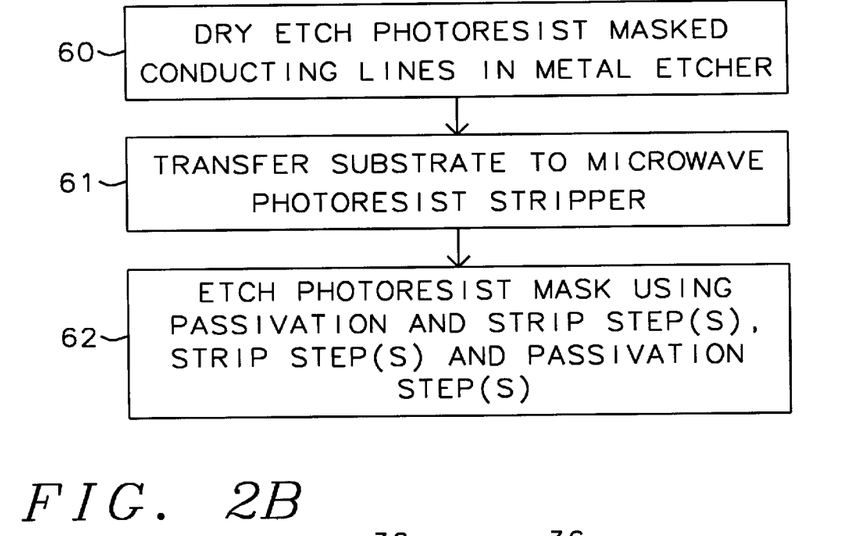
FIG. 2B, which is a flow chart of the method of a second embodiment of the present invention.

Alternatively, the process flow, as shown in FIG. 2B, may consist of the following sequence: Step 60, where dry etching of photoresist masked conducting lines takes place in a metal etcher tool; Step 61, where the substrate is transferred to a microwave photoresist stripper chamber; Step 62, where the remaining photoresist mask is removed using combined passivation and strip step(s), strip step(s) and passivation steps(s) carried out in the microwave photoresist stripper chamber.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of a conductive interconnection layer in an integrated circuit comprising:

loading a wafer cassette, containing substrates having a photoresist mask pattern formed over a conductive material layer, to a plasma etcher apparatus;

etching said conductive material layer by vertical anisotropic etching;

transferring said substrate to a second heated chamber; and first stripping, using a microwave generated plasma, said photoresist mask in said second heated chamber in a first plasma containing $O_2$ and $H_2O$, wherein after first stripping, said photoresist mask is further stripped in the second heated chamber in a second microwave generated plasma containing $O_2$ and $N_2$.

2. The method of claim 1, wherein said second heated chamber is controlled in the temperature range between about 100° and 400° C.

3. The method of claim 1, wherein said first stripping of said photoresist mask is in a microwave plasma containing $O_2$ at a flow between about 200 and 1000 sccm and $H_2O$ at a flow between about 100 and 1500 sccm, at a total pressure between about 1 and 10 Torr, and said microwave plasma has a frequency of about 2.45 GHz and applied power between about 600 and 1800 Watts.

4. The method of claim 3, wherein said first stripping of said photoresist mask is in a microwave plasma containing $O_2$ and $H_2O$, where the ratio of $O_2$ to $H_2O$ is between about 0.05 and 10.

5. The method of claim 1, wherein said conductive material layer is Ti/TiN/Al—Cu/TiN.

6. The method of claim 1, wherein said conductive material layer is Ti/TiW/Al—Cu/TiN.

7. The method of claim 1, wherein said conductive material layer is Ti/Al—Cu/TiN.

8. The method of claim 1, wherein said conductive material layer is Ti/TiN/Al—Cu/Ti/TiN.

9. The method of claim 1, wherein said first microwave plasma containing $O_2$ and $H_2O$ further contains one or more gases from the group comprising nitrogen, hydrogen, fluorine, fluorocarbons, fluorine-substituted hydrocarbons, hydrogen bromide, forming gas and argon or other inert gases.

10. The method of claim 9, wherein the ratio of $O_2$ relative to each of the additional gases is between about 1 and 100.

11. The method of claim 1, wherein said second microwave generated plasma containing $O_2$ and $N_2$ comprises $O_2$ at a flow between about 1000 and 5000 sccm and $N_2$ at a flow between about 100 and 900 sccm, at a total pressure between about 1 and 10 Torr, and said second microwave generated plasma has a frequency of about 2.45 GHz and applied power between about 600 and 1800 Watts.

12. The method of claim 1, wherein said second microwave generated plasma containing $O_2$ and $N_2$ comprises $O_2$ and $N_2$, where the ratio of $O_2$ to $N_2$ is between about 1 and 100.

13. The method of claim 1, wherein said second microwave generated plasma containing $O_2$ and $N_2$ further contains one or more gases from the group comprising hydrogen, fluorine, fluorocarbons, fluorine-substituted hydrocarbons, hydrogen bromide, forming gas and argon or other inert gases.

14. The method of claim 13, wherein the ratio of $O_2$ relative to each of the additional gases is between about 1 and 100.

15. The method of claim 1, wherein the initiation of said first stripping, using a microwave generated plasma, of said photoresist mask in said second heated chamber in a first plasma containing $O_2$ and $H_2O$ is preceded by one or more steps that occur when the substrate is transferred to the second heated chamber, where said one or more steps are from the group comprising the steps of: a) heating the substrate to a predetermined temperature; b) reducing or eliminating chlorine, chlorine compounds and chloride compounds from the photoresist, sidewall residue and metal through heating and/or using one or more gases from the group containing fluorine, fluorine-substituted hydrocarbons, fluorocarbons, nitrogen, hydrogen, forming gas and argon and other inert gases; or c) stabilizing gas flows in the second heated chamber.

16. The method of claim 1, wherein after first stripping, using a microwave generated plasma, said photoresist mask in said second heated chamber in a first plasma containing $O_2$ and $H_2O$ said photoresist mask is further stripped one or more times in said second heated chamber in a microwave generated plasma containing $O_2$ and $H_2O$.

17. The method of claim 16, wherein the further stripping one or more times in said second heated chamber takes place in a microwave generated plasma containing $O_2$ at a flow between about 200 and 1000 sccm and $H_2O$ at a flow between about 100 and 1500 sccm, at a total pressure between about 1 and 10 Torr, and said microwave plasma has a frequency of about 2.45 GHz and applied power between about 600 and 1800 Watts.

18. The method of claim 17, wherein said further stripping one or more times of said photoresist mask is in a microwave plasma containing $O_2$ and $H_2O$, where the ratio of $O_2$ to $H_2O$ is between about 0.05 and 10.

19. The method of claim 1, wherein after first stripping, using a microwave generated plasma, said photoresist mask in said second heated chamber in a first plasma containing $O_2$ and $H_2O$, said photoresist mask is further stripped in said second heated chamber in a second microwave generated plasma containing $H_2O$.

20. The method of claim 19, wherein said second microwave generated plasma containing $H_2O$ comprises $H_2O$ at a flow between about 100 and 1500 sccm, at a total pressure between about 1 and 10 Torr, and said second microwave generated plasma has a frequency of about 2.45 GHz and applied power between about 600 and 1800 Watts.

21. The method of claim 19, wherein said second microwave generated plasma containing $H_2O$ further contains one or more gases from the group comprising hydrogen, fluorine, fluorocarbons, fluorine-substituted hydrocarbons, hydrogen bromide, forming gas and argon or other inert gases.

22. The method of claim 1, wherein after first stripping, using a microwave generated plasma, said photoresist mask in said second heated chamber in a first plasma containing $O_2$ and $H_2O$ said photoresist mask is further stripped in said second heated chamber in subsequent two or more microwave generated plasmas containing $O_2$, $N_2$, and $H_2O$.

23. The method of claim 22, wherein said second microwave generated plasma containing $O_2$, $N_2$, and $H_2O$ further contains one or more gases from the group comprising hydrogen, fluorine, fluorocarbons, fluorine-substituted hydrocarbons, hydrogen bromide, forming gas and argon or other inert gases.

24. The method of claim 1, wherein said plasma containing $O_2$ and $H_2O$ is implemented to further strip said photoresist mask one or more times after the first step or after more than one step from the start of the photoresist stripping.

* * * * *